United States Patent
Adachi et al.

(10) Patent No.: US 9,192,081 B2
(45) Date of Patent: Nov. 17, 2015

(54) WIRING STRUCTURE OF WIRE HARNESS AND SHIELDING COVER

(75) Inventors: Hideomi Adachi, Shizuoka (JP); Hidehiko Kuboshima, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 13/823,854

(22) PCT Filed: Sep. 16, 2011

(86) PCT No.: PCT/JP2011/071783
§ 371 (c)(1), (2), (4) Date: Mar. 15, 2013

(87) PCT Pub. No.: WO2012/039490
PCT Pub. Date: Mar. 29, 2012

(65) Prior Publication Data
US 2013/0175087 A1    Jul. 11, 2013

(30) Foreign Application Priority Data

Sep. 24, 2010   (JP) ................................. 2010-213054

(51) Int. Cl.
| | | |
|---|---|---|
| *H01B 7/00* | (2006.01) | |
| *H02G 3/04* | (2006.01) | |
| *H05K 9/00* | (2006.01) | |
| *H02G 3/08* | (2006.01) | |

(52) U.S. Cl.
CPC .. *H05K 9/00* (2013.01); *H02G 3/04* (2013.01); *H02G 3/0487* (2013.01); *H02G 3/088* (2013.01); *H05K 9/0098* (2013.01)

(58) Field of Classification Search
CPC ....... H02G 3/04; H02G 3/0487; H02G 3/088; H05K 9/00; H05K 9/0098
USPC ...... 174/107, 651, 72 A, 35 R, 135, 174/681–68.3; 361/816, 818, 826
See application file for complete search history.

(56) References Cited

U.S. PATENT DOCUMENTS

| | | | |
|---|---|---|---|
| 6,439,929 B1 * | 8/2002 | Jenets ...................... | 439/607.51 |
| 7,530,847 B2 * | 5/2009 | Siems ...................... | 439/607.41 |
| 2003/0062177 A1 | 4/2003 | Yagi et al. | |
| 2004/0099427 A1 * | 5/2004 | Kihira ......................... | 174/35 C |
| 2005/0045357 A1 | 3/2005 | Ichikawa et al. | |
| 2006/0278423 A1 | 12/2006 | Ichikawa et al. | |

(Continued)

FOREIGN PATENT DOCUMENTS

| | | |
|---|---|---|
| DE | 10 2005 054 926 A1 | 6/2006 |
| JP | 2003-115223 A | 4/2003 |
| JP | 2005-80449 A | 12/2009 |

OTHER PUBLICATIONS

PCT/ISA/210 for PCT/JP2011/071783 dated Dec. 21, 2012.
PCT/ISA/237 for PCT/JP2011/071783 dated Dec. 21, 2012.
Japanese Office Action for the related Japanese Patent Application No. 2010-213054 dated Aug. 5, 2014.

(Continued)

*Primary Examiner* — Yuriy Semenenko
(74) *Attorney, Agent, or Firm* — Kenealy Vaidya LLP

(57) ABSTRACT

A wiring structure can include a wire harness and a conductive shielding cover. The wiring structure can be subjected to swing, heat, and the countermeasure against electromagnetic shield. In the wiring structure, a conducting path of a harness body of the wire harness and a conductive shielding cover that covers the wire harness are partly put into at least one of a contact state and a holding state directly or indirectly.

10 Claims, 8 Drawing Sheets

(56) References Cited

U.S. PATENT DOCUMENTS

2008/0185183 A1* 8/2008 Chen .............................. 174/651
2009/0167078 A1   7/2009 Watanabe
2010/0122831 A1* 5/2010 Watanabe ..................... 174/107
2010/0126752 A1   5/2010 Watanabe

OTHER PUBLICATIONS

Chinese Office Action for the related Chinese Patent Application No. 201180046085.1 dated May 5, 2015.
The European Office Action for the related European Patent Application No. 11 770 185.4 dated Jun. 29, 2015.

* cited by examiner

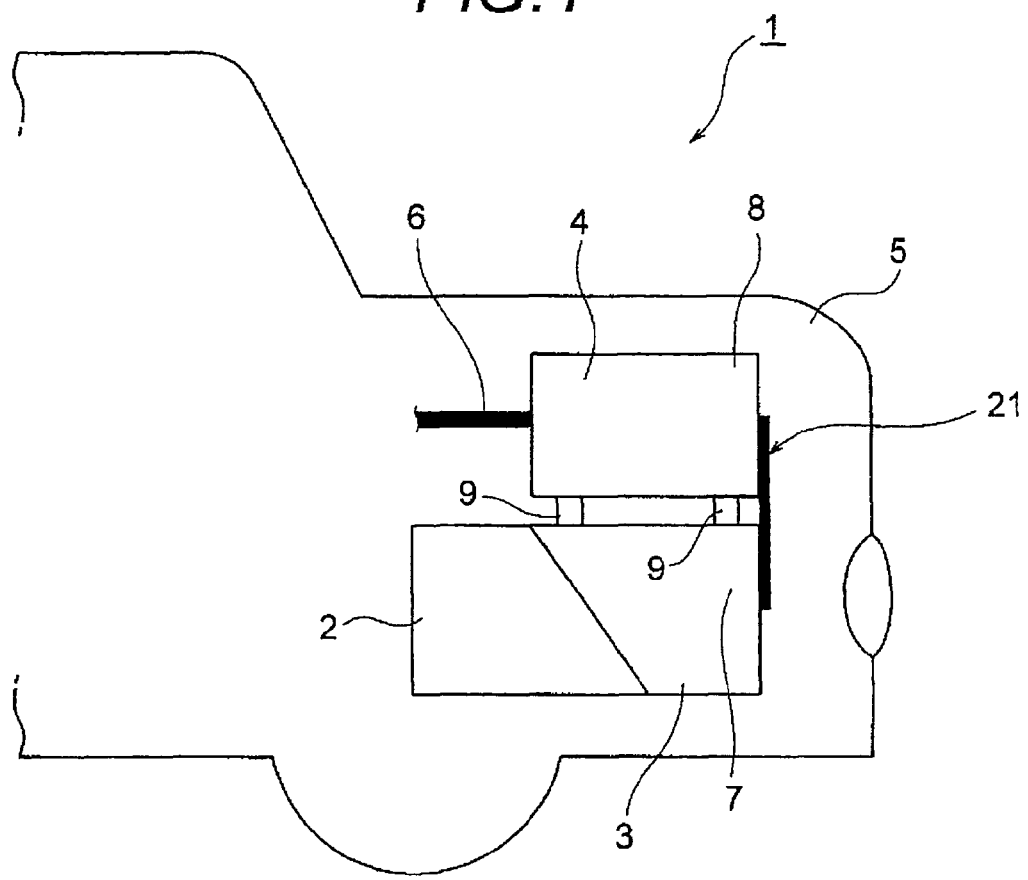

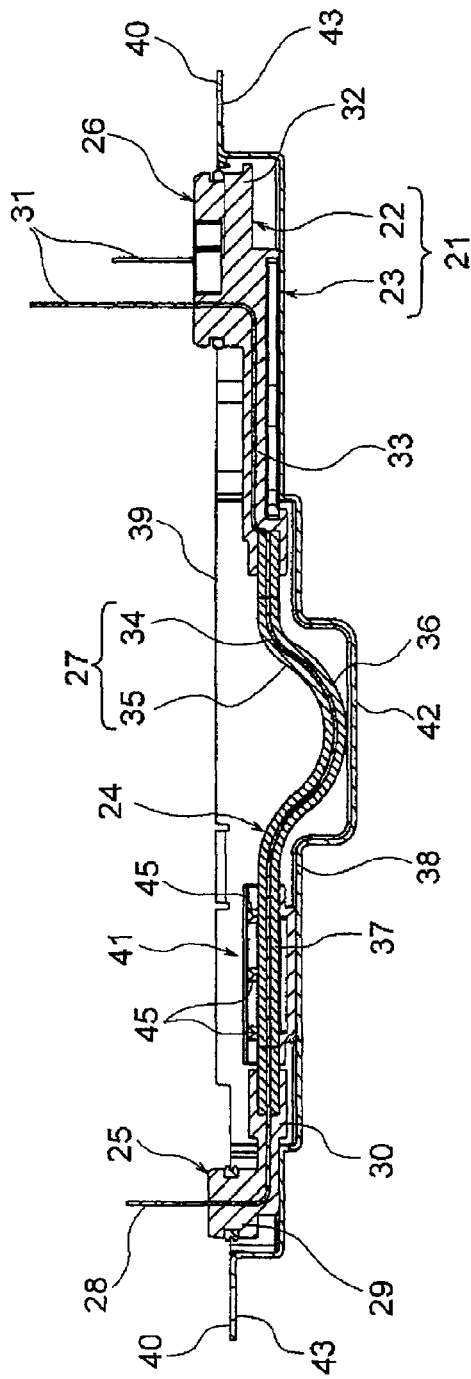
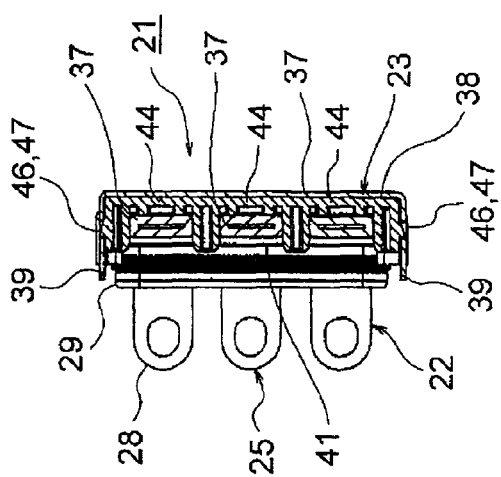
FIG.4A
FIG.4B

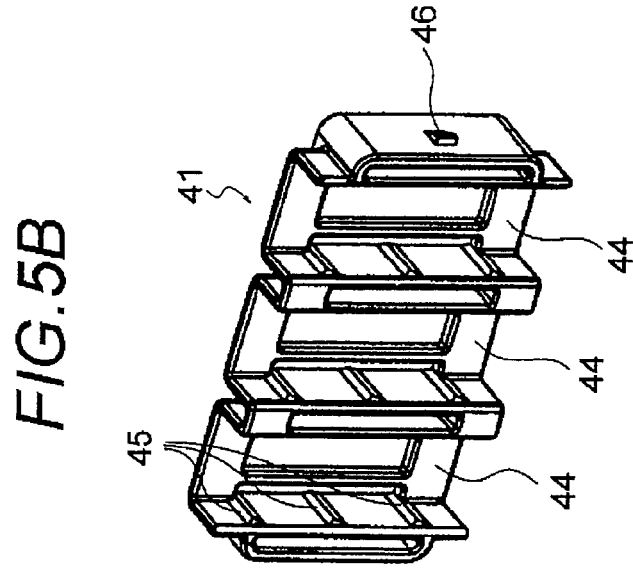
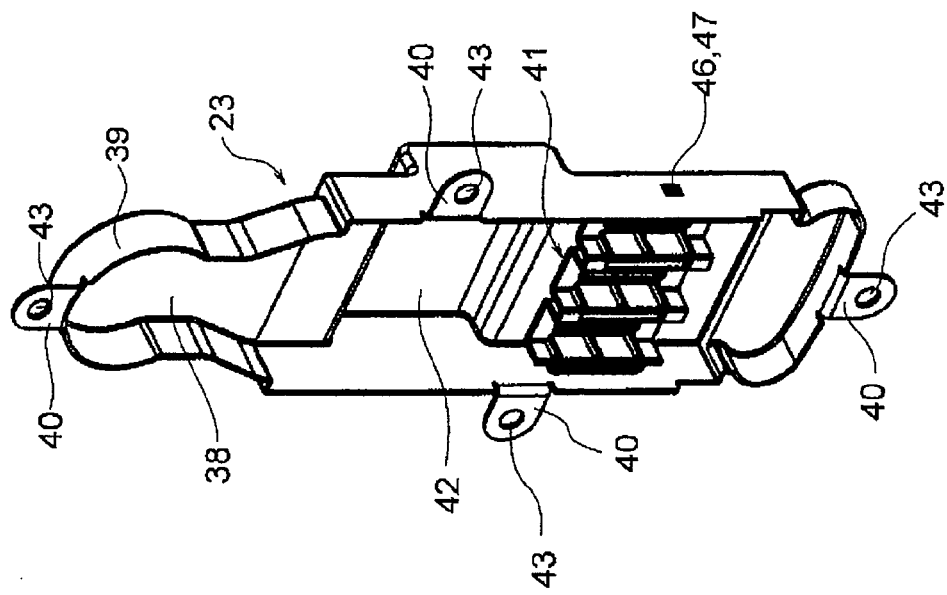

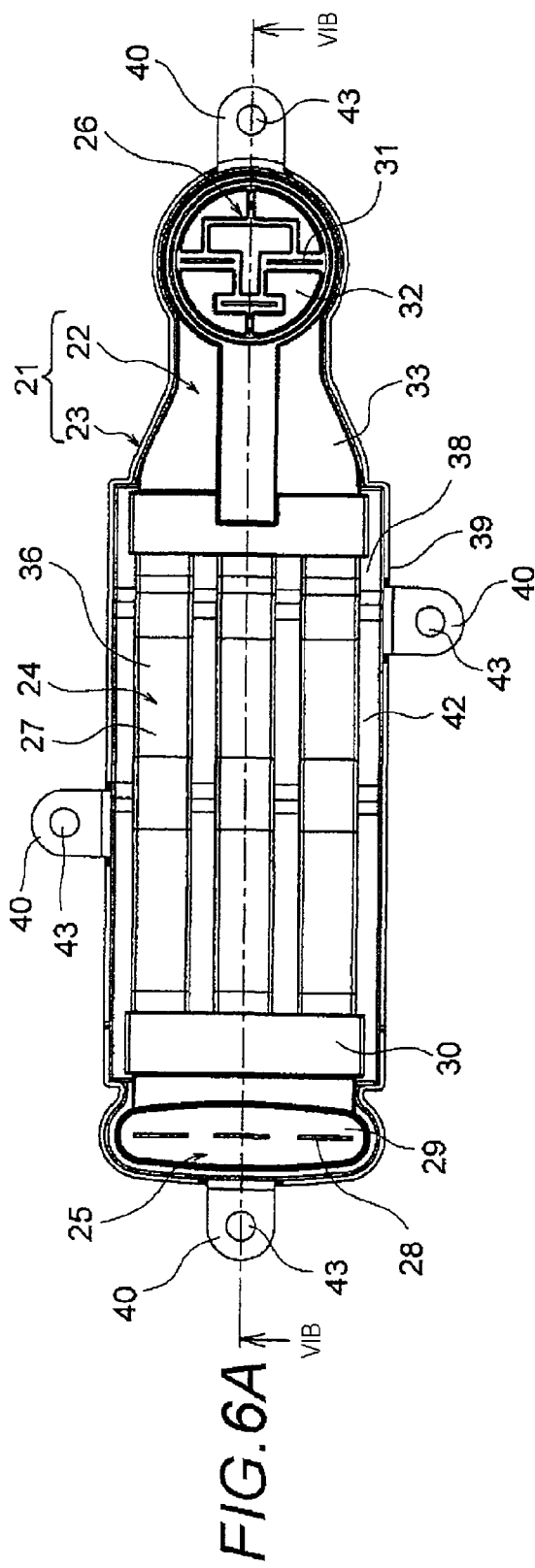
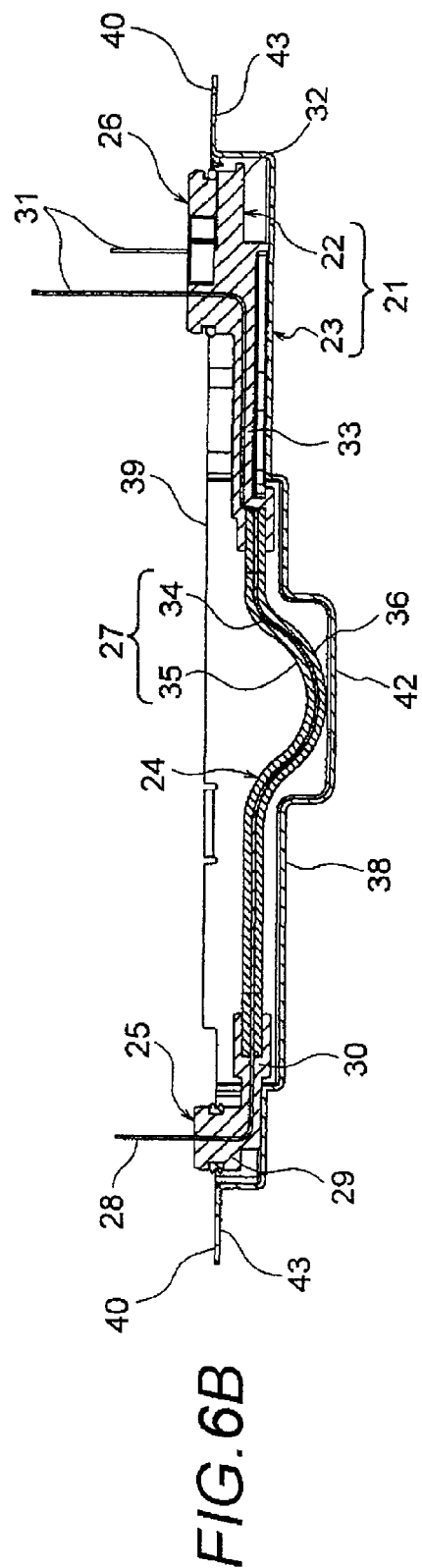
FIG.6A
FIG.6B

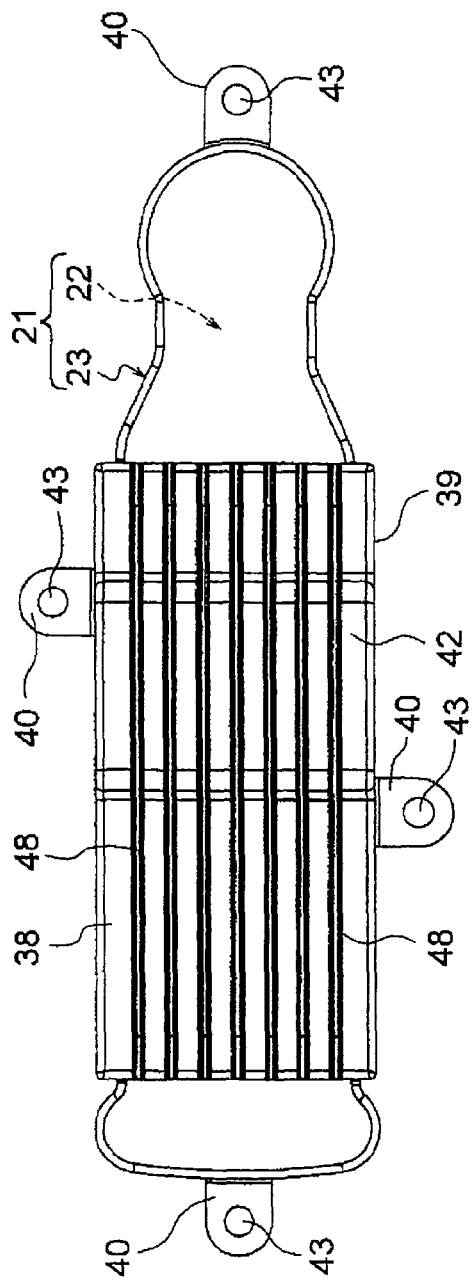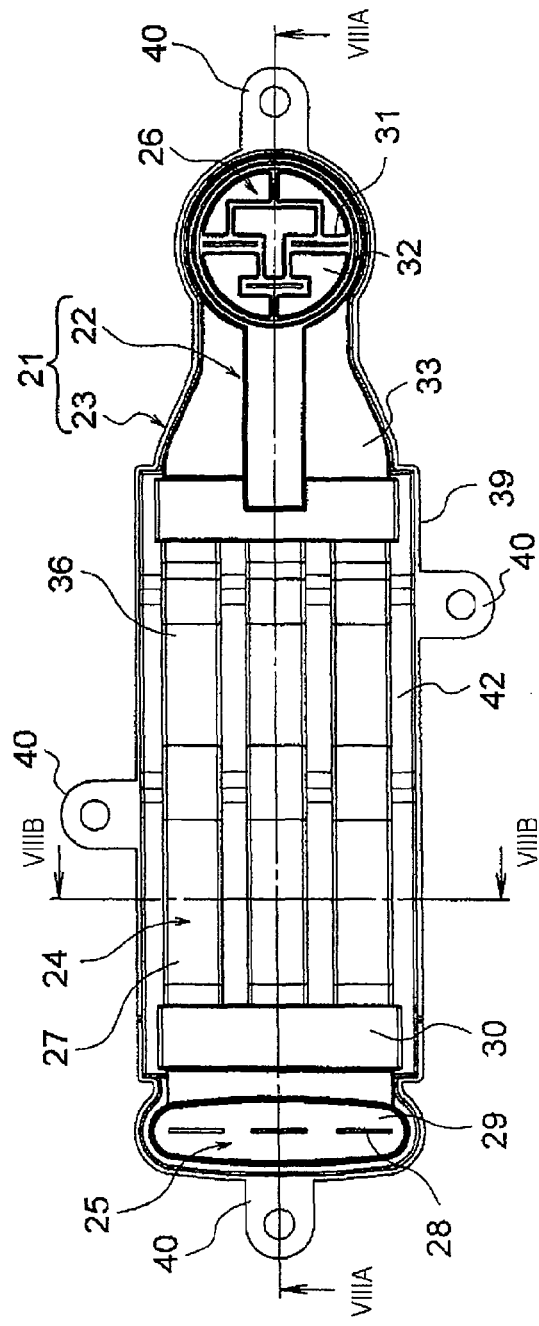

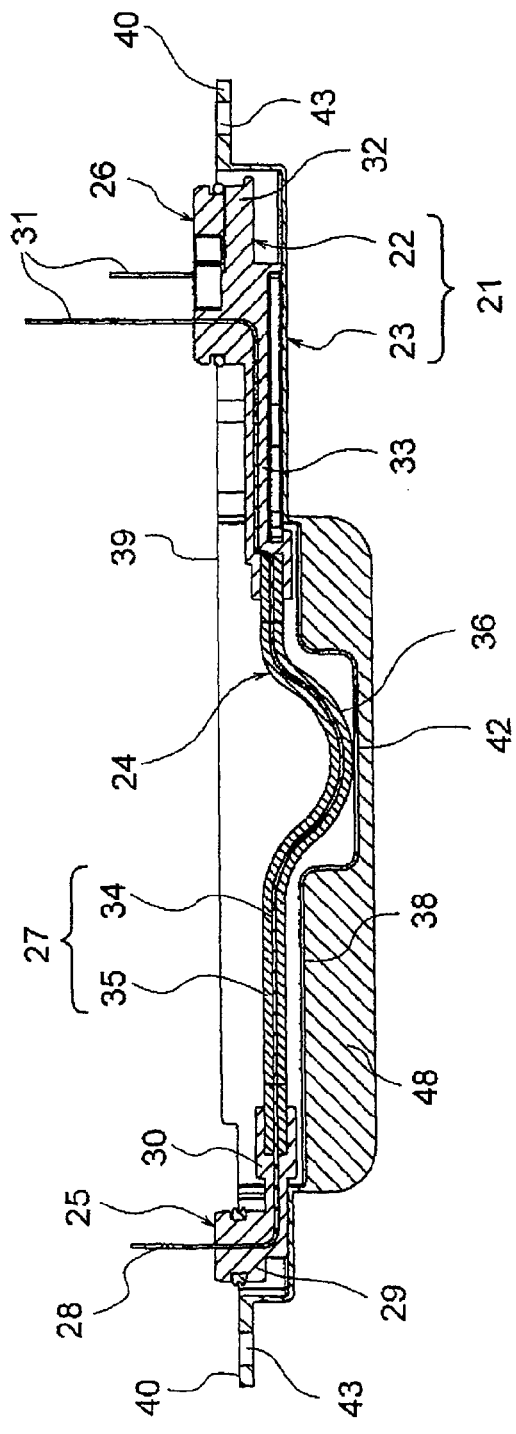
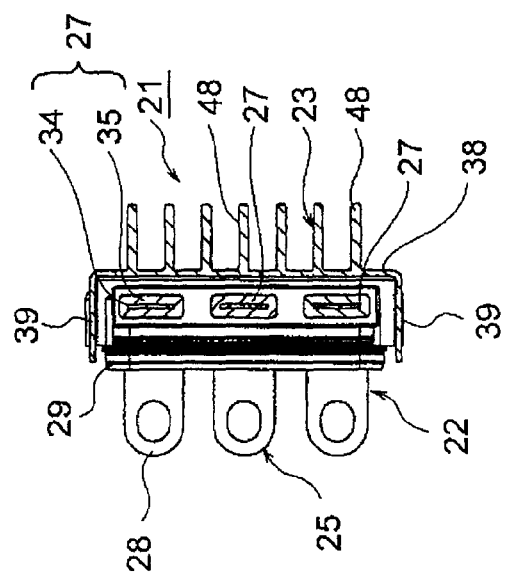
FIG.8A
FIG.8B

WIRING STRUCTURE OF WIRE HARNESS AND SHIELDING COVER

TECHNICAL FIELD

The present invention relates to a wiring structure in which a wire harness is covered with a shielding cover, and relates to a shielding cover used for the wiring structure.

BACKGROUND ART

In an electric vehicle and a hybrid vehicle, for example, a motor unit and an inverter unit mounted in these vehicles are connected via a wire harness for large current and high voltage (see Patent Literature 1). The wire harness for large current and high voltage is subjected to countermeasure against electromagnetic shield.

CITATION LIST

Patent Literature

Patent Literature 1: JP-A-2003-115223

SUMMARY OF INVENTION

Technical Problem

Since it is common that the wire harness is wired under an environment in which a swing occurred during driving of the vehicle is easily transferred to the wire harness, there is fear of the influence by the swing. There is also fear of the influence by the heat-generation of the wire harness itself and the heat transferred from the connection destination. It is considered to be preferable that these influences do not produce any problems in the case where the wire harness is subjected to the countermeasure against electromagnetic shield.

The present invention has been achieved in view of the circumstances, and an object of the invention is to provide a wiring structure of wire harness capable of reducing an influence due to the swing and heat even in the case where the wire harness is subjected to the countermeasure against electromagnetic shield. Further, another object is to provide a shielding cover capable of reducing an influence due to the swing and heat.

Solution to Problem

A first aspect of the invention is to provide a wiring structure of a wire harness, wherein a conducting path of a harness body of the wire harness and a conductive shielding cover that covers the wire harness are partly put into at least one of a contact state and a holding state directly or indirectly.

According to the configuration, once the conducting path of the harness body and the shielding cover are put into at least one of the contact state in part and the holding state in part, the heat of the wire harness side can be transferred to the shield cover side to be irradiated. Further, the swing of the wire harness side can be also suppressed. It is more effective that they are put into the holding state for the suppression of the swing.

The wiring structure may be configured, in a second aspect, so that a curved part is formed in the conducting path, the curved part serving as a part which contacts the shielding cover directly, and a convex part is formed in the shielding cover, an inner surface of the convex part serving as a part which contacts the curved part directly.

According to the configuration, the heat of the wire harness side can be transferred through the curved part of the wire harness and the convex part of the shielding cover to the shield cover side to be irradiated.

The wiring structure may be configured, in a third aspect, so that the shielding cover is provided with vibration-countermeasure means.

According to the configuration, the swing of the wire harness side is absorbed by the vibration-countermeasure means, and the effective suppression of the swing can be led.

The wiring structure may be configured, in a fourth aspect, so that the vibration-countermeasure means includes a holding part in a groove shape having a C-shaped cross-section, and a held part of the conducting path is fitted into and held by the holding part of the vibration-countermeasure means to serve as a part which is held by the shielding cover indirectly.

According to the configuration, the swing of the wire harness side is absorbed by a holding state of the holding part of the vibration-countermeasure means and held part of the wire harness.

The wiring structure may be configured, in a fifth aspect, so that the shielding cover is provided with heat-irradiating means.

According to the configuration, the heat transferred from the wire harness side can be effectively irradiated by the heat-irradiating means of the shielding cover.

A sixth aspect of the invention provides a shielding cover which has conductivity and covers a wire harness, the shielding cover including a part that is put into at least one of a contact state and a holding state directly or indirectly with a part of a conducting path of a harness body of the wire harness.

According to the configuration, once the part of the shielding cover contacts and/or holds a part of the conducting path, the heat of the wire harness side is transferred to the shielding cover, and the shielding cover irradiates the transferred heat. Further, the swing of the wire harness side can be suppressed. It is more effective that the shielding cover has a part that is put into the holding state for the suppression of the swing.

Advantageous Effects of Invention

According to the first and second aspects of the invention, it is possible to provide a wiring structure capable of reducing an influence of the swing and heat even if the wire harness is subjected to the countermeasure against electromagnetic shield.

According to the third and fourth aspects of the invention, it is possible to suppress the swing of the wire harness side effectively.

According to the fifth aspect of the invention, it is possible to irradiate the heat transferred from the wire harness side effectively.

According to the sixth aspect of the invention, it is possible to provide a shielding cover capable of reducing an influence of the swing and heat generated in the wire harness side.

BRIEF DESCRIPTION OF DRAWINGS

FIG. 1 is a schematic view of a hybrid vehicle which adopts a wiring structure of wire harness according to an aspect of the invention.

FIG. 4A is a cross-sectional view taken along line IVA-IVA in FIG. 3B.

FIG. 4B is a cross-sectional view taken along line IVB-IVB in FIG. 3B.

FIG. 5A is a perspective view of a shielding cover as viewed from a side of a swing-countermeasure member.

FIG. 5B is an enlarged perspective view of the swing-countermeasure member.

FIG. 6A is a bottom view of a wiring structure of wire harness according to a second embodiment of the invention.

FIG. 6B is a cross-sectional view taken along line VIB-VIB in FIG. 6A.

FIG. 7A is a plan view of a wiring structure of wire harness according to a third embodiment of the invention.

FIG. 7B is a bottom view of the wiring structure of wire harness according to the third embodiment of the invention.

FIG. 8A is a cross-sectional view taken along line VIIIA-VIIIA in FIG. 7B.

FIG. 8B is a cross-sectional view taken along line VIIIB-VIIIB in FIG. 7B.

DESCRIPTION OF EMBODIMENTS

Figure 2A:
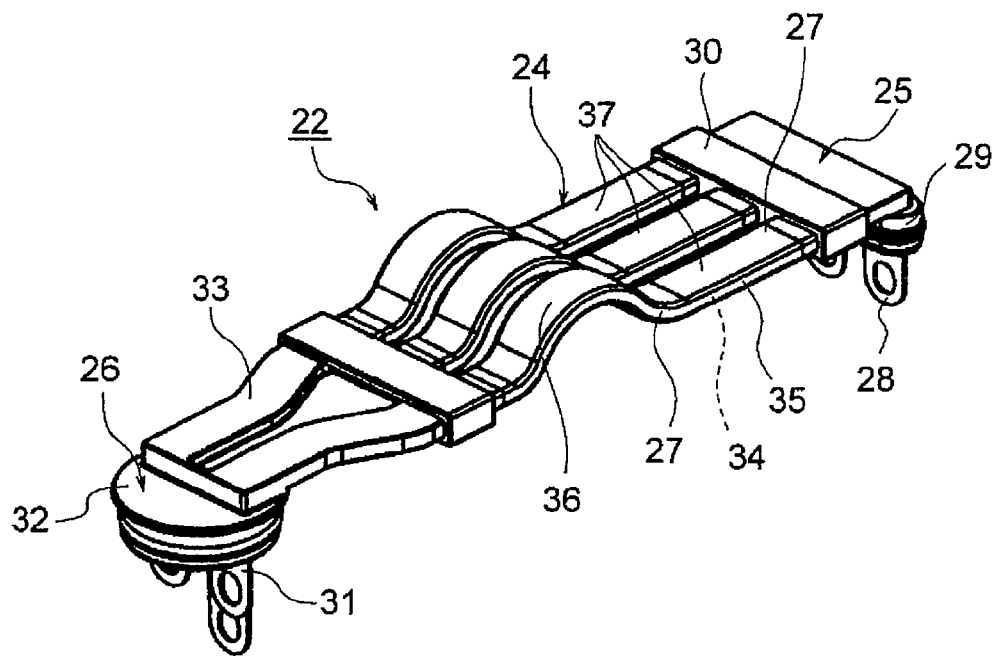
FIG. 2A is a perspective view of a wire harness according to a first embodiment of the invention.

A wiring structure, which includes a wire harness and a shielding cover for electromagnetic shield countermeasure that covers the wire harness, is a structure for causing a conducting path of a harness body in the wire harness and the shield cover to be in a partially-contact state and/or in a partially-hold state.

The wire harness according to an aspect of the invention is directed, for example, to one wired in a hybrid vehicle, or an electric vehicle. Hereinafter, the description is made with an example of the hybrid vehicle. The configuration, structure, and the effect of the wire harness are basically the same in a case of the electric vehicle. Further, the application of the wire harness according to the embodiment is not limited to the hybrid vehicle or the electric vehicle, and it can be also applied to a normal vehicle, etc.

FIG. 1 is a schematic view of a hybrid vehicle which adopts a wiring structure of wire harness according to the aspect of the invention.

FIG. 1 shows a hybrid vehicle 1. The hybrid vehicle 1 is a type of vehicle which is driven by mixing two kinds of power generated by an engine 2 and a motor unit 3. The motor unit 3 is supplied a power from a battery (a battery pack) not shown in figure through an inverter unit 4. In the embodiment, the engine 2, the motor unit 3 and the inverter unit 4 are mounted in an engine room 5 at a front position of the hybrid vehicle 1 where front wheels exist. The battery not shown is mounted in an interior space of the vehicle in the rear of the engine room 5, or at a rear part of the vehicle where rear wheels exist.

The motor unit 3 is connected to the inverter unit 4 by a wiring structure 21 of wire harness according to the aspect of the invention. The battery not shown in figure is connected to the inverter unit 4 by a high-voltage wire harness 6 according to the aspect of the invention. The wire harness 6 is wired, for example, through an underfloor space located at a ground side of a floor panel of the vehicle from the engine room 5.

A supplementary explanation of the aspect of the invention will be given. The motor unit 3 includes a motor and a generator. The inverter unit 4 includes an inverter and a converter. The motor unit 3 is formed as a motor assembly which includes a shielding case 7. The inverter unit is also formed as an inverter assembly which includes a shielding case 8. The battery not shown in figure is a type of Ni-MH (Nickel metal hydride) or Li-ion (Lithium-ion), and is modularized. A secondary battery device such as a capacitor can be utilized as the battery. The type of the battery is not limited if it can be utilized in the hybrid vehicle 1 or the electric vehicle.

The inverter unit 4 is arranged and fixed above the motor unit 3. That is, the inverter unit 4 and the motor unit 3 are arranged in proximity with each other. Since such arrangement is adopted, the wiring structure 21 of wire harness is short. Fixing foot parts 9 are provided to arrange and fix the inverter unit 4 above the motor unit 3.

Hereinafter, embodiments of the wiring structure 21 of wire harness will be explained.

First Embodiment

Figure 2B:
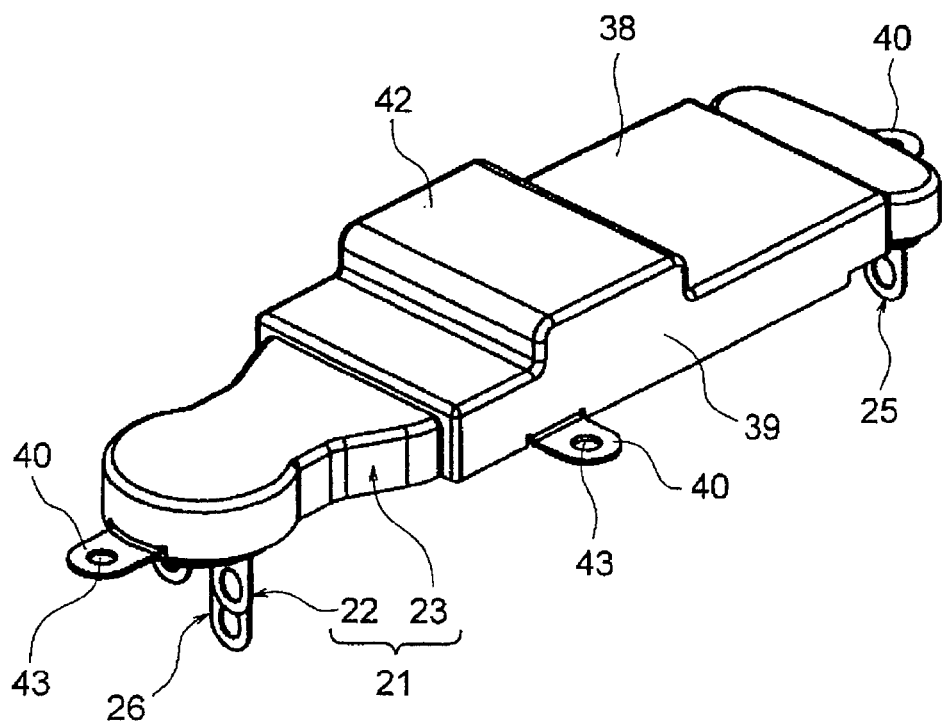
FIG. 2B is a perspective view of a wiring structure of wire harness according to the first embodiment of the invention.
Figure 3A:
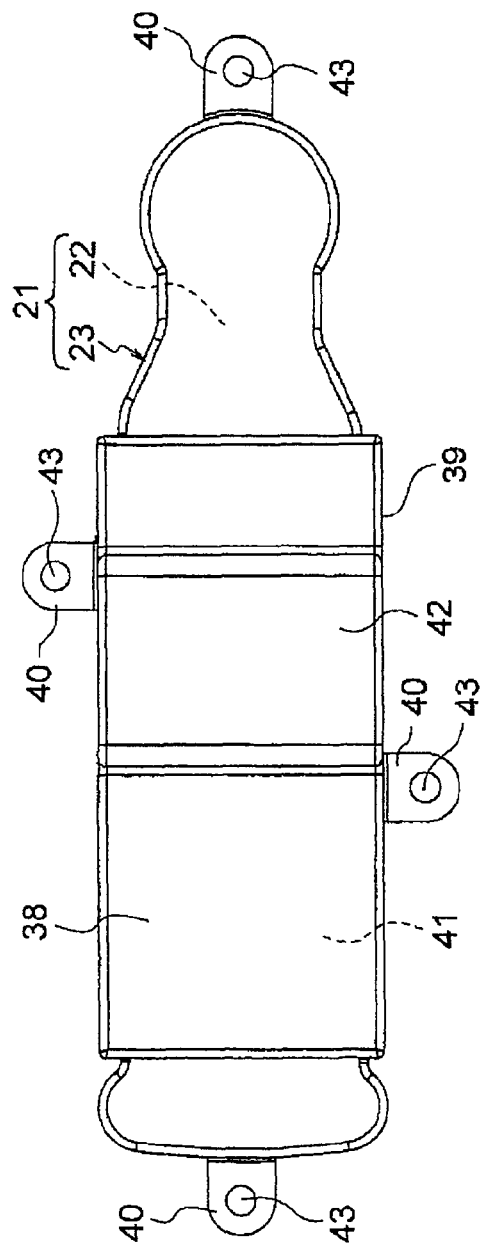
FIG. 3A is a plan view of the wiring structure of wire harness according to the first embodiment of the invention.
Figure 3B:
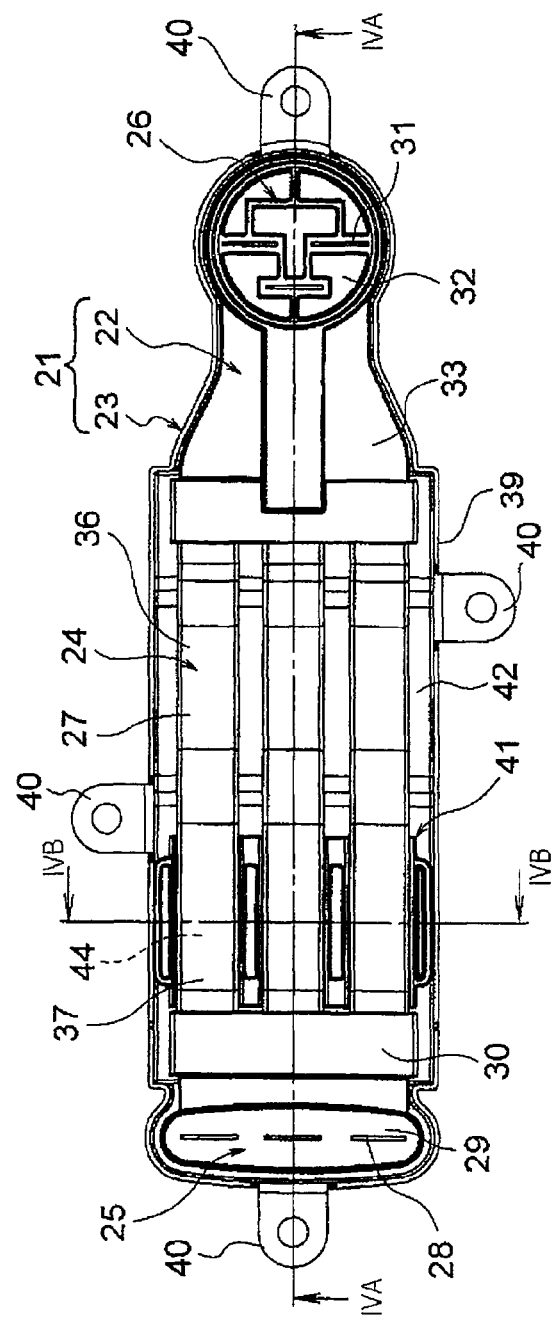
FIG. 3B is a bottom view of the wiring structure of wire harness according to the first embodiment of the invention.

A first embodiment will be explained with reference to drawings. FIG. 2A is a perspective view of a wire harness according to a first embodiment of the invention. FIG. 2B is a perspective view of a wiring structure of wire harness according to the first embodiment. FIG. 3A is a plan view of the wiring structure of wire harness. FIG. 3B is a bottom view of the wiring structure of wire harness. FIG. 4A is a cross-sectional view taken along line IVA-IVA in FIG. 3B. FIG. 4B is a cross-sectional view taken along line IVB-IVB in FIG. 3B. FIG. 5A is a perspective view of a shielding cover as viewed from a side of a swing-countermeasure member. FIG. 5B is an enlarged perspective view of the swing-countermeasure member.

In FIG. 2A to FIG. 3B, the wiring structure 21 of wire harness includes a wire harness 22, a shielding cover 23 for electromagnetic shield countermeasure that covers the wire harness 22, and a plurality of bolts (member for fixing with screw, not shown in figure) for connecting and fixing the shielding cover 23 to shield cases 7, 8 (refer to FIG. 1).

The wire harness 22 includes a harness body 24, a motor-side connector 25 provided at one end of the harness body 24, and an inverter-side connector 26 provided at the other end of the harness body 24. The harness body 24 includes a plurality of (e.g., three) high-voltage conducting paths 27 (or just referred to as "conducting path") which are aligned with a predetermined gap in substantially the common plane.

The motor-side connector 25 is inserted into the shield case 7 (refer to FIG. 1) of the motor unit 3, and electrically connected inside the shield case 7. The inverter-side connector 26 is inserted into the shield case 8 (refer to FIG. 1) of the inverter unit 4 as well, and electrically connected inside the shield case 8.

The motor-side connector 25 includes a terminal part 28, an insulating housing 29, and an over-mold part 30 that is continuous from the housing 29 and over-molds a continuation portion of the terminal part 28 and the high-voltage conductor path 27. The inverter-side connector 26 includes a terminal part 31, an insulating housing 32, and an over-mold part 33 that is continuous from the housing 32 and over-molds a continuation portion of the terminal part 31 and the high-voltage conductor path 27.

As shown in FIG. 4A, the high-voltage conducting path 27 includes a conductor 34 and an insulator 35 that covers the conductor 34. One end and the other end of the conductor 34 continue to the terminal parts 28 and 31, respectively. In the first embodiment, the conductor 34 is formed by press-working a metallic plate having conductivity (e.g., copper-, copper alloy-, or aluminum-made plate). That is, the conductor 34 is formed into a bus bar shape (or a belt shape) having predetermined width and thickness.

The shape of the conductor 34 is not limited to the bus bar shape. For example, the shape may be in a structure of a conductor in which strands are twisted, or in a structure of a rod-shape conductor having a rectangular cross-section or a circular cross-section (for example, a structure of conductor formed by a rectangular single core or a circular single core).

The insulator 35 has an insulating property, and is formed so as to protect and waterproof the conductor 34, etc. The insulator 35 is formed by over-molding by using elastomer such as rubber or thermoplastic elastomer.

A curved part 36 is formed in the high-voltage conducting path 27 of the first embodiment. The curved part 36 is formed as a part which contacts the shielding cover 23 directly. The curved part 36 is formed in a shape of protrusion in about a semi-circular arc. This shape of the curved part 36 is one example. That is, the shape of the curved part 36 is not limited to this only if the curved part 36 contacts the shielding cover 23 directly. When the curved part 36 is not formed, a part of the shielding cover 23 may be protruded to be contact with the high-voltage conducting path 27.

A held part 37 is formed in the high-voltage conducting path 27 of the first embodiment. The held part 37 is formed as part which is held by the shielding cover 23 indirectly. The shape of the held part 37 is not limited to a specific one only if formed in a shape to be held. In the first embodiment, the held part 37 corresponds to a non-processed straight part of the high-voltage conducting path 27.

As shown in FIG. 2A to FIG. 5B, the shielding cover 23 is formed of a conductive metallic material capable of realizing an electromagnetic shielding property with respect to the wire harness 22, and the shielding cover 23 covers entirety of the wire harness 22. The shielding cover 23 according to the first embodiment includes a ceiling wall 38, a side wall 39 extended from a peripheral edge of the ceiling wall 38, and a plurality of fixing parts 40 connected at a predetermined position of the side wall 39. As shown in FIG. 2B, the shielding cover 23 is formed in a box shape. The shielding cover 23 according to the first embodiment is provided with a vibration-countermeasure member 41 (vibration-countermeasure means).

A convex part 42 is formed in the ceiling wall 38. The convex part 42 is formed so that a part of the ceiling wall 38 is protruded when viewed from the outside (formed in a concave part when viewed from the inside). The convex part 42 is formed so that its inner surface serves as a contact part with respect to the curved part 36 of the wire harness. When the inner surface contacts the curved part 36, the convex part 42 absorbs the heat to be generated in the wire harness 22, and the heat can be irradiated by substantially entirety of the shielding cover 23.

The fixing part 40 is fixed with a screw to the shield case 7 (refer to FIG. 1) of the motor unit 3 and the shield case 8 (refer to FIG. 1) of the inverter unit 4. The fixing part 40 is formed in a tongue-piece shape which has a screw hole 43.

The shielding cover 23 is formed by drawing a conductive metallic plate or by punching and folding the metallic plate. The shielding cover 23 according to the first embodiment has a structure of a single component, but it is not only applied to this. The shielding cover 23 may have a division structure of two components.

As shown in FIG. 3A to FIG. 5B, the vibration-countermeasure member 41 is a component fixed inside the shielding cover 23, and holds the held part 37 of the wire harness 22, thereby suppressing the swing of the wire harness 22. Although the vibration-countermeasure member 41 according to the first embodiment is a resin-molded product, it may be formed of an elastomer such as rubber in order to enhance the absorption of the vibration or to absorb the collision with the held part 37. Hereinafter, the vibration-countermeasure member 41 will be explained more specifically with reference to FIGS. 5A and 5B.

As shown in FIGS. 5A and 5B, the vibration-countermeasure member 41 is formed by aligning a plurality of (e.g., three) holding parts 44 in a groove shape having a C-shaped cross-section. The holding parts 44 are arranged in correspondence with the alignment of the high-voltage conducting paths of the wire harness 22. A plurality of protrusions 45 are formed on a groove side part of each holding part 44 to press the side part of the held part 37 of the wire harness 22. The protrusions 45 are formed so as to bring into a state where the held part 37 is fitted into the holding part 44.

The vibration-countermeasure member 41 is formed so that the groove bottom of each holding part 44 contacts the inner surface of the ceiling wall 38 of the shielding cover 23. The vibration-countermeasure member 41 is so that its both sides are retained to the side walls 39 of the shielding cover 23. In the first embodiment, retaining protrusions 46 are formed on opposite sides of the vibration-countermeasure member 41. These retaining protrusions 46 are locked in retaining holes 47 of the side walls 39 of the shielding cover 23 to be retained.

A connection work of the motor unit 3 and the inverter unit 4 by the wire harness 22, and an assembly work of the wiring structure 21 of wire harness will be explained on the basis of the above explained configuration and structure. The explanation is made while referring to FIG. 1 to FIG. 5B.

After the wire harness 22 is produced, firstly, a work of connecting the motor-side connector 25 of the wire harness 22 to the motor unit 3 is performed. At this time, the motor-side connector 25 passes through the shield case 7. Further, the motor-side connector 25 is electrically connected inside the shield case 7. Next, a work of connecting the inverter-side connector 26 of the wire harness 22 to the inverter unit 4 is performed. At this time, the inverter-side connector 26 passes through the shield case 8. Further, the inverter-side connector 26 is electrically connected inside the shield case 8. In this way, a work concerning the connection of the wire harness 22 is completed.

Subsequently, a work of covering the wire harness 22 with the shielding cover 23 and fixing it with the screw is performed. In the work of covering with the shielding cover 23, the vibration-countermeasure member 41 which has been previously provided holds the held part 37 of the wire harness 22. Accordingly, it is put into a state where the swing of the wire harness 22 is suppressed. Further, in the work of covering with the shielding cover 23, the inner surface of the convex part 42 of the shielding cover 23 contacts the curved part 36 of the wire harness 22. Accordingly, it is put into a state where the heat generated in the wire harness 22 is irradiated by substantially entirety of the shielding cover 23. In this way, a work concerning the assembly of the wiring structure 21 of wire harness is completed. The wire harness 22 is subjected to electromagnetic shield countermeasure, and it is put into a state where the influence of the noise is not received.

According to the wiring structure 21 of wire harness of the first embodiment, it is possible to hardly receive an influence of swing or heat even if the wire harness 22 is subjected to the countermeasure against electromagnetic shield.

Second Embodiment

Hereinafter, a second embodiment of the invention will be explained with reference to drawings. FIG. 6A is a bottom view of a wiring structure of wire harness according to a second embodiment of the invention. FIG. 6B is a cross-sectional view taken along line VIB-VIB in FIG. 6A. The constituent elements same as those in the first embodiment are given the same reference signs, and their detailed explanation will be omitted.

As shown in FIGS. 6A and 6B, the wiring structure 21 of wire harness according to the second embodiment differs from that in the first embodiment in not providing the vibration-countermeasure member 41, as found in comparison with FIGS. 3A to 4B. In the second embodiment, the inner surface of the convex part 42 of the shielding cover 23 contacts the curved part 36 of the wire harness 22. Accordingly, it is put into a state where the heat generated in the wire harness 22 is irradiated by substantially entirety of the shielding cover 23. Further, since the inner surface of the convex part 42 contacts the curved part 36, the wire harness 22 is pressed and held by the inner surface, and it is hardly swung.

According to the wiring structure 21 of wire harness of the second embodiment, it is possible to hardly receive an influence of swing or heat even if the wire harness 22 is subjected to the countermeasure against electromagnetic shield, as well as in the first embodiment.

Hereinafter, a third embodiment of the invention will be explained with reference to drawings. FIG. 7A is a plan view of a wiring structure of wire harness according to a third embodiment of the invention. FIG. 7B is a bottom view of the wiring structure of wire harness according to the third embodiment of the invention. FIG. 8A is a cross-sectional view taken along line VIIIA-VIIIA in FIG. 7B. FIG. 8B is a cross-sectional view taken along line VIIIB-VIIIB in FIG. 7B. The constituent elements same as those in the first and second embodiments are given the same reference signs, and their detailed explanation will be omitted.

As shown in FIGS. 7A to 8B, the wiring structure 21 of wire harness according to the third embodiment differs from that in the second embodiment in providing a plurality of heat-irradiating fins 48 (heat-irradiating means) on an outer surface of the ceiling wall 38 of the shielding cover 23, as found in comparison with FIGS. 6A and 6B. The heat-irradiating fin 48 corresponds to a part for expanding a surface area of the shielding cover 23, and is formed in a rib shape extending in straight along a longitudinal direction of the shielding cover 23. By providing the plurality of heat-irradiating fins, the shielding cover 23 can irradiate heat efficiently. The shape of the heat-irradiating fin 48 of the third embodiment is not limited to this only if the surface area of the shielding cover 23 can be increased.

According to the wiring structure 21 of wire harness of the third embodiment, it is possible to hardly receive an influence of swing or heat even if the wire harness 22 is subjected to the countermeasure against electromagnetic shield, as well as in the first and second embodiments.

The present invention can be implemented by various modifications without departing from the essence of the present invention.

This application is based upon and claims the benefit of priority of Japanese Patent Application No. 2010-213054 filed on Sep. 24, 2010, the contents of which are incorporated herein by reference in its entirety.

INDUSTRIAL APPLICABILITY

The wiring structure and the shielding cover according to an aspect of the invention are useful in a case where they are mounted in a vehicle which is required to cause electric wires to be subjected to electromagnetic shield countermeasure, such as a hybrid vehicle, an electric vehicle, or a normal vehicle.

The invention claimed is:

1. A wiring structure comprising:
a wire harness including a harness body, the harness body including an elongated conducting path; and
a conductive shielding cover configured to cover the wire harness and to adopt at least one of a contact state and a holding state with the conducting path, each of the contact and holding states being achieved by virtue of either direct or indirect contact between the conductive shielding cover and the conducting path;
wherein the conducting path defines both a protrusion and a first portion that is spaced from the protrusion in a direction of elongation of the conducting path, the conductive shielding cover defining both a contact portion configured to contact the protrusion and a second portion that is spaced from the contact portion in the direction of elongation of the conducting path, the first and second portions being spaced from each other in a direction that is perpendicular to the direction of elongation of the conducting path.

2. The wiring structure according to claim 1, wherein
the protrusion is a curved part formed in the conducting path, the curved part serving as a part which contacts the shielding cover directly, and
the contact portion is a convex part formed in the shielding cover, an inner surface of the convex part serving as a part which contacts the curved part directly.

3. The wiring structure according to claim 1, wherein
the shielding cover is provided with a vibration-countermeasure member.

4. The wiring structure according to claim 3, wherein
the vibration-countermeasure member includes a holding part in a groove shape having a C-shaped cross-section, and
a held part of the conducting path is fitted into and held by the holding part of the vibration-countermeasure member to serve as a part which is held by the shielding cover indirectly.

5. The wiring structure according to claim 1, wherein
the shielding cover is provided with a heat-irradiating member.

6. A conductive shielding cover for covering a wire harness, the conductive shielding cover comprising:
a ceiling wall terminating at a peripheral edge;
a side wall extending from the peripheral edge and away from the ceiling wall, surrounding the ceiling wall, and cooperating with the ceiling wall to form at least a portion of a box shape that is open only on one side of the shielding cover; and
a part that is configured to be placed into at least one of a contact state and a holding state directly or indirectly with a part of a conducting path of a harness body of the wire harness.

7. The shielding cover according to claim 6, wherein
a convex part is formed in the shielding cover, an inner surface of the convex part serving as the part which is configured to contact a curved part formed in the conducting path of the harness body of the wire harness directly.

8. The shielding cover according to claim 6, further comprising a vibration-countermeasure member.

9. The shielding cover according to claim 8, wherein the vibration-countermeasure member includes a holding part in a groove shape having a C-shaped cross-section to serve as the part which holds a held part of the conducting path indirectly.

10. The shielding cover according to claim 6, further comprising a heat-irradiating member.

\* \* \* \* \*